United States Patent [19]
Fukuyoshi et al.

[11] Patent Number: 5,667,853
[45] Date of Patent: Sep. 16, 1997

[54] MULTILAYERED CONDUCTIVE FILM, AND TRANSPARENT ELECTRODE SUBSTRATE AND LIQUID CRYSTAL DEVICE USING THE SAME

[75] Inventors: Kenzo Fukuyoshi; Yukihiro Kimura, both of Tamana; Koji Imayoshi, Kumamoto-ken; Osamu Koga, Tamana; Katsunori Horachi, Yokaichi, all of Japan

[73] Assignee: Toppan Printing Co., Ltd., Tokyo, Japan

[21] Appl. No.: 619,240

[22] Filed: Mar. 21, 1996

[30]  Foreign Application Priority Data

| Mar. 22, 1995 | [JP] | Japan | 7-088797 |
| Mar. 22, 1995 | [JP] | Japan | 7-088798 |
| Mar. 22, 1995 | [JP] | Japan | 7-088799 |
| Aug. 31, 1995 | [JP] | Japan | 7-223403 |
| Aug. 31, 1995 | [JP] | Japan | 7-223405 |

[51] Int. Cl.⁶ .................................... G02F 1/1343
[52] U.S. Cl. .............................. 428/1; 428/472; 428/702; 349/139
[58] Field of Search ........................ 428/1, 472, 702; 349/147, 139

[56]  References Cited

U.S. PATENT DOCUMENTS 4,166,876  9/1979  Chiba et al. ............................ 428/472

Primary Examiner—Alexander Thomas
Attorney, Agent, or Firm—Burns, Doane, Swecker & Mathis, LLP

[57]  ABSTRACT

A multilayered conductive film has a silver-based layer formed of a silver-based metallic material. A first transparent oxide layer is provided on one surface of the silver-based layer, and a second transparent oxide layer is provided on the other surface of the silver-based layer. The first and second transparent oxide layers are independently formed of a compound oxide material of indium oxide with at least one secondary metal oxide whose metallic element has substantially no solid solubility in silver.

16 Claims, 5 Drawing Sheets

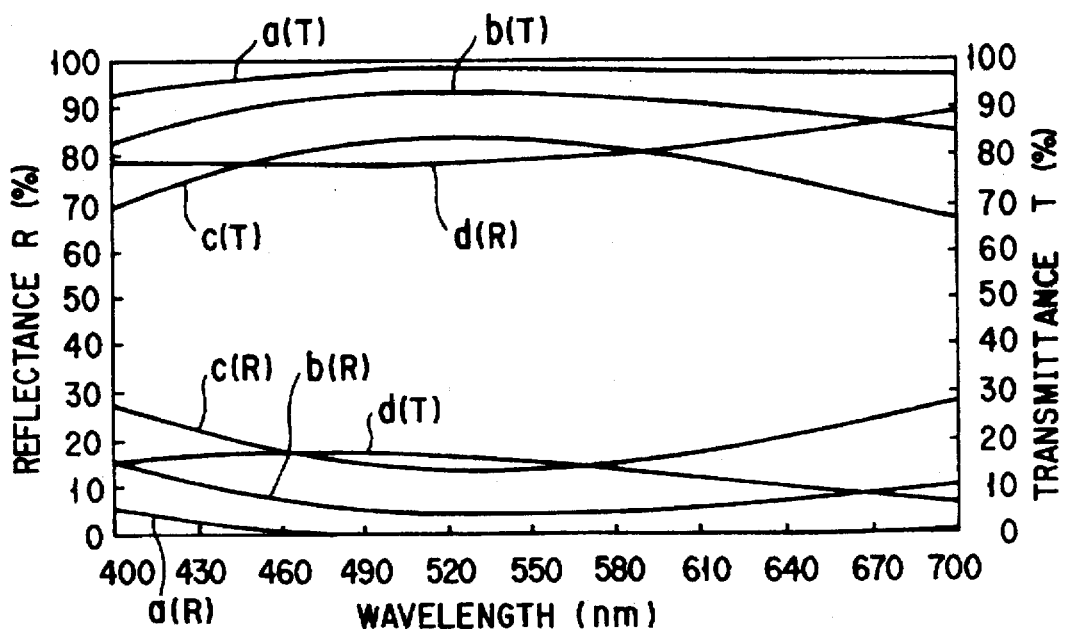
F I G. 5
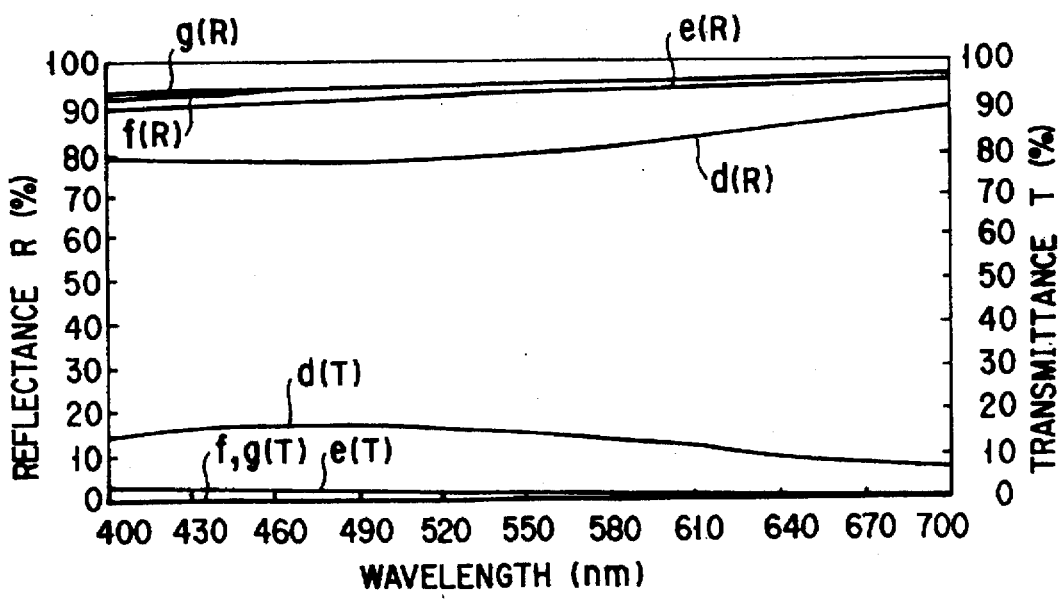
F I G. 6

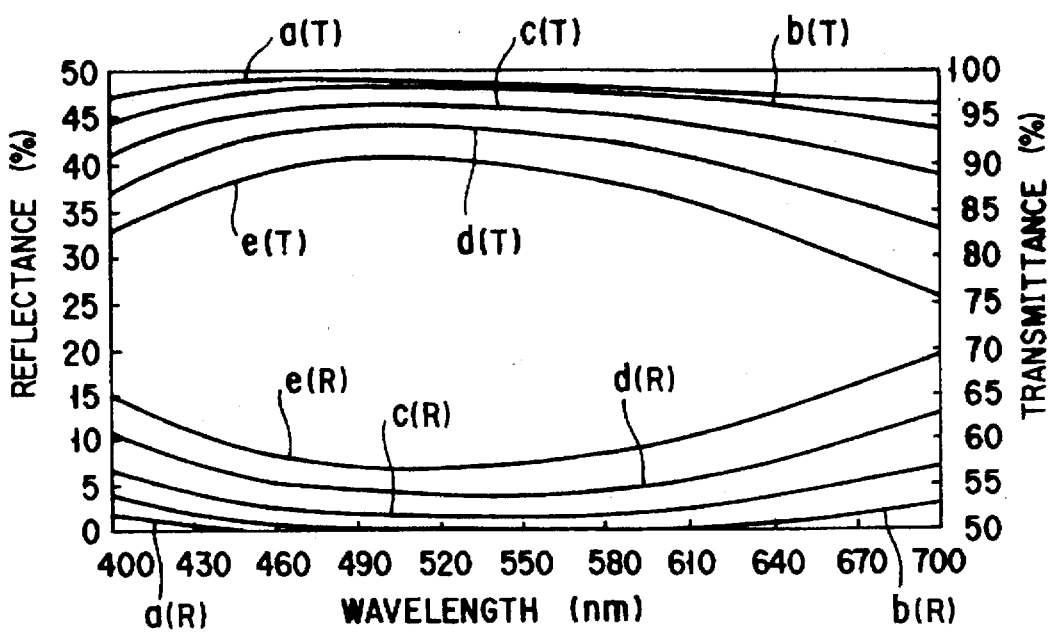
F I G. 7
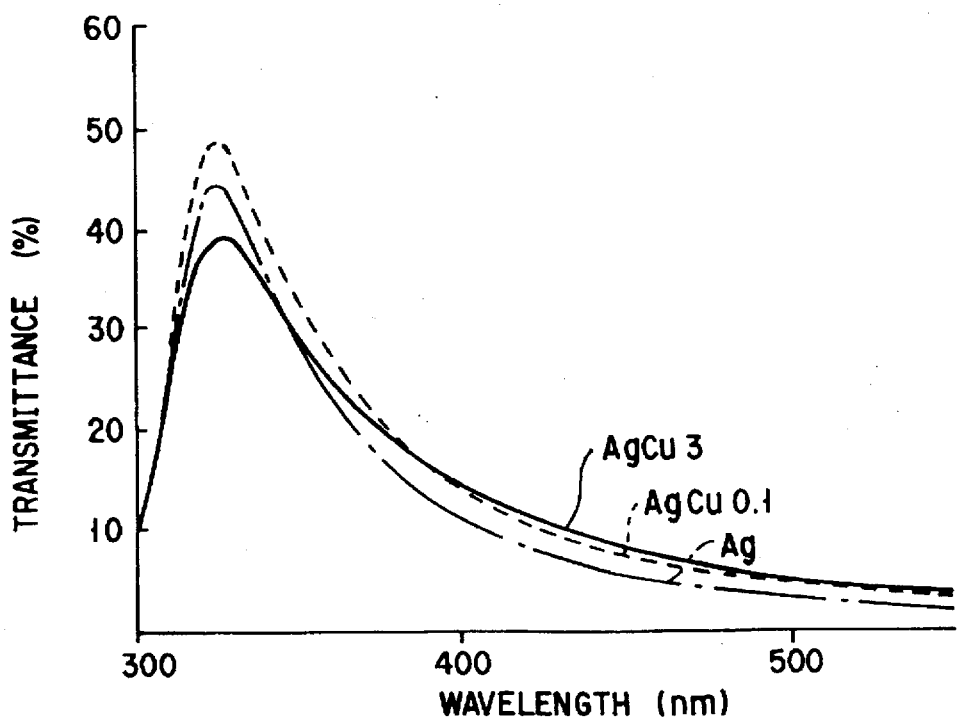
F I G. 8

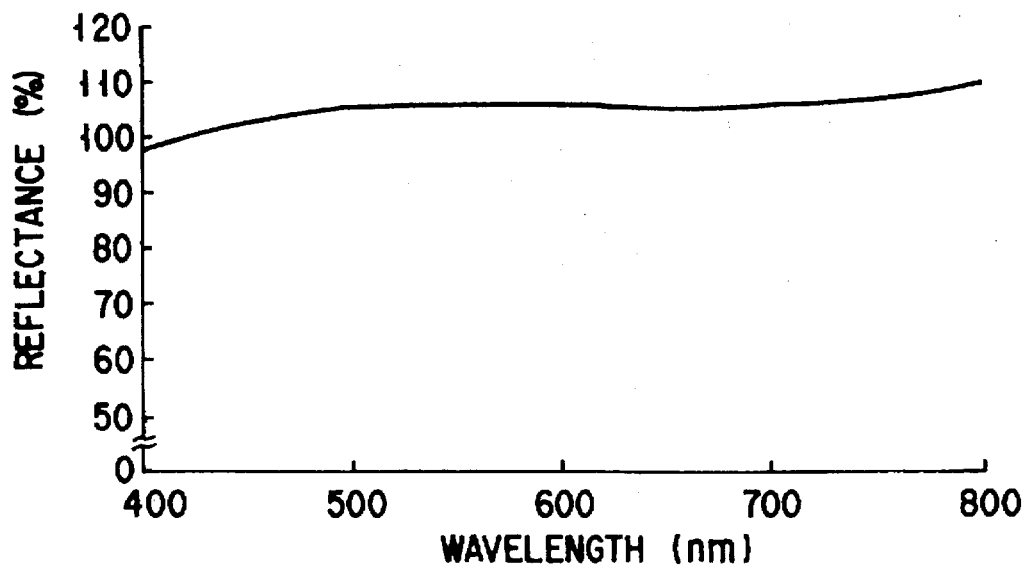
F I G. 12
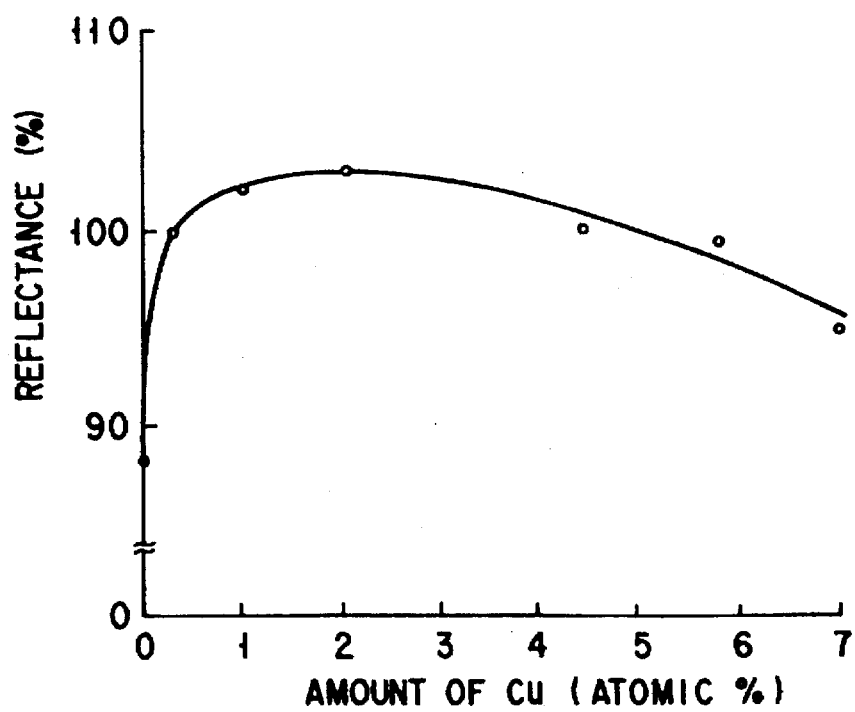
F I G. 13

MULTILAYERED CONDUCTIVE FILM, AND TRANSPARENT ELECTRODE SUBSTRATE AND LIQUID CRYSTAL DEVICE USING THE SAME

BACKGROUND OF THE INVENTION

1. Field of the Invention

The present invention relates to an electrically conductive multilayered film, and a transparent electrode substrate and a liquid crystal display device using the same, and more particularly to a multilayered conductive film having a high storage stability, and a transparent electrode substrate and a liquid crystal display device, using such a multilayered conductive film.

2. Description of the Related Art

An electrode substrate having a transparent electrode film or a light-reflecting electrode film formed on a substrate such as glass or plastic film is widely used as a displaying electrode for various display devices such as liquid crystal display devices, and as an input-output electrode for directly inputting power thereinto from the display image screen.

For example, a transparent electrode substrate has a glass substrate, and a color filter layer which is formed at the pixel sites, and colors each light transmitted through each pixel in red, green and blue. At the sites (inter-pixel sites) between the pixels, a light-shielding film is formed which prevents the light from transmitting through these inter-pixel sites. On the entire surface of the color filter layer, a protective film is formed, and a transparent electrode is formed on the protective film. An orientation film is formed on the transparent electrode. The transparent electrode is made of an electrically conductive transparent film which is formed by sputtering technique and is etched into the predetermined electrode pattern.

As the transparent conductive film, a thin film of ITO, indium oxide added with tin oxide, is widely utilized because of its high electrical conductivity. It has a resistivity of about $2.4 \times 10^{-4} \Omega \cdot cm$, and exhibits a sheet resistance of about $10\Omega$/square when it has a thickness of about 240 nm, a thickness which is usually applied as a transparent electrode.

In addition to the ITO film, thin films of tin oxide, of tin oxide added with antimony oxide (NESA film), and of zinc oxide added with antimony oxide are known. However, these films are inferior to the ITO film in conductivity, and have an insufficient resistance to chemicals such as acids and alkalis, and an insufficient water or moisture resistance. Therefore, these films are not widely used.

Recently, the above-mentioned display devices and input-output devices have been required of displaying fine images by increasing the density of pixels. Thus, it is required that the transparent electrode pattern have a high density. For example, it is required that the terminals of the transparent electrode be formed at a pitch of about 100 μm. Further, in the system (COG) in which an integrated circuit (IC) is directly connected to the substrate, the wiring sometimes has fine portions having a width of 20 to 50 μm, and thus it is required that the electrode material have so high etching processability and so high conductivity (low resistivity) that have not been required in the past. The ITO material can not meet these requirements.

On the other hand, a larger display screen is required. It is necessary to use, as the transparent electrode, a transparent conductive film having a high conductivity such that it exhibits a sheet resistance of $5\Omega$/square, in order that a transparent electrode of fine pattern as mentioned above can be formed and a sufficient driving voltage is applied to the liquid crystal. In addition, a sheet resistance as low as $3\Omega$/square or less is required when a multi-gradation display of 16 or more gradations is effected in a liquid crystal display device of a simple matrix driving system, utilizing, for example, an STN mode liquid crystal materials. The ITO material can not meet these requirements, either.

Meanwhile, silver has the highest conductivity among metals, and ensures a sufficient transparency and a sufficient conductivity even when formed into a thin film. For example, at a thickness of 5 to 30 nm, silver exhibits a transparency sufficient to transmit visible light, and a sheet resistance of about 2 to $5\Omega$/square. Accordingly, silver is a promising material as a conductive material which meets the low resistivity requirements mentioned above.

However, silver is damaged in about one week when allowed to stand at room temperature in air. More specifically, silver reacts with sulfur compounds and water present in air to form the sulfide and the oxide on its surface, and is thus deteriorated. For these reasons, silver is not commonly used as a light-reflecting electrode in a reflective type liquid crystal display device, or a light-reflecting substrate, either, although silver may have a reflectivity higher than aluminum and may establish a high contrast display on the screen.

A transparent conductive film of a three-layered structure in which an ITO thin layer or an indium oxide (IO) thin layer is formed on each surface of a silver thin layer has been proposed in Published Unexamined Japanese Patent Application (Kokai) Nos. 63-173395, 1-12663 and 2-37326, and The 7th ICVM held in Japan, 1982. This three-layered transparent conductive film has a low sheet resistance of about $5\Omega$/square, and has been hoped for the application to the transparent electrode.

However, even in this conductive film of three-layered structure, the silver thin layer reacts with the water entering at the interfaces between the layers to form the oxide on its surface, creating stain-like defects which lead to display insufficiency on the screen when the film is applied as the transparent electrode in a liquid crystal display device, for example.

SUMMARY OF THE INVENTION

Accordingly, it is an object of the present invention to provide a conductive film which exhibits a good electrical conductivity even when formed into a thin layer, and which is high in a storage stability, with suppressed deterioration with time.

A further object of the invention is to provide a transparent electrode substrate and a liquid crystal display device having such a conductive film.

These and other objects which may become apparent from the following detailed description have been achieved according to the present invention by a multilayered conductive film comprising a silver-based layer formed of a silver-based metallic material and having first and second surfaces; a first transparent oxide layer provided on the first surface of the silver-based layer; and a second transparent oxide layer provided on the second surface of the silver-based layer; the first and second transparent oxide layers being independently formed of a compound oxide material of indium oxide, a primary oxide, with at least one secondary metal oxide whose metallic element has substantially no solid solubility in silver.

Further, according to the present invention, there is provided a transparent electrode substrate having a multilayered conductive film of the invention, which is transparent, formed on a transparent substrate.

Further, according to the present invention, there is provided a liquid crystal display device comprising an observer-side electrode substrate, a rear-side electrode substrate arranged opposite to the observer-side electrode substrate, and a liquid crystal material sealed between these electrode substrates, at least one of the electrode substrates being constituted by the transparent electrode substrate of the invention.

Still further, according to the present invention, there is provided a liquid crystal display device comprising an observer-side electrode substrate provided with a transparent electrode, a rear-side electrode substrate provided with a light-reflecting electrode and arranged opposite to the observer-side electrode substrate, and a liquid crystal material sealed between these electrode substrates, the light-reflecting electrode being constituted by the multilayered conductive film, which is light-reflecting, according to the invention.

BRIEF DESCRIPTION OF THE DRAWINGS

FIGS. 5 and 6 are graphs showing the relationship of the thickness of a silver-based layer in a multilayered conductive film of the invention with the transmittance and reflectance of the multilayered conductive film;

FIG. 7 is another graph showing the relationship of the thickness of a silver-based layer in a multilayered conductive film of the invention with the transmittance and reflectance of the multilayered conductive film;

FIG. 8 is a graph showing the relationship of the amount of copper added to the silver-based layer with the transmittance of the multilayered conductive film;

FIG. 12 is a graph showing the transmittance of the multilayered conductive film fabricated in another Example of the invention; and FIG. 13 is a graph showing the relationship of the amount or concentration of copper added to the silver-based layer with the transmittance of the multilayered conductive film.

DETAILED DESCRIPTION OF THE PREFERRED EMBODIMENTS

The present inventors have made extensive studies to develop a multilayered conductive film which exhibits a good electrical conductivity even when it is formed into a thin film, and which has a high storage stability without deterioration over a long period of time. As a result, they have found that when a compound oxide material of indium oxide with cerium oxide, titanium oxide, or the like is used as a transparent oxide layer which is formed on each surface of a silver-based layer, instead of an ITO or IO layer, the resultant multilayered conductive film has a very high stability and moisture resistance. Based on these findings, the present inventors have finally found out that by applying, on a silver-based film, a compound oxide material of indium oxide (a primary oxide) with at least one secondary metal oxide whose metallic element has substantially no solid solubility in silver, as a transparent oxide layer, the objects of the invention can be achieved.

The present invention will be described in detail below with reference to the accompanying drawings.

Figure 1:
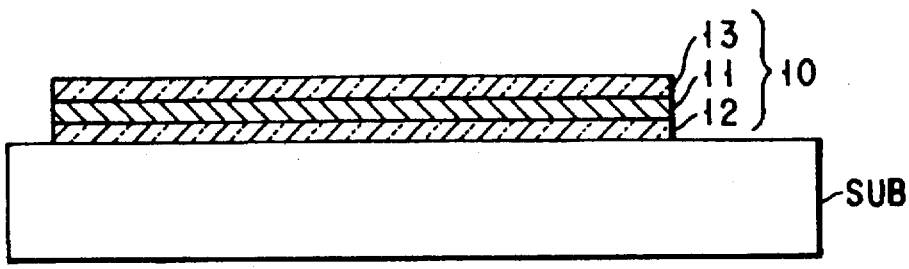
FIG. 1 shows a cross-sectional view of a multilayered conductive film of the present invention which is formed on a substrate.

FIG. 1 shows a cross-sectional view illustrating a multilayered conductive film of three-layered structure according to the invention.

The multilayered conductive film 10 shown is constituted by a silver-based thin layer 11 formed of a silver-based metallic material, a first transparent oxide thin layer 12 provided on a first surface (rear surface) of the silver-based thin layer 11, and a second transparent oxide thin layer 13 provided on a second surface (front surface) of the silver-based thin layer 11. The multilayered conductive film 10 is provided on a substrate SUB.

Both the first and second transparent oxide thin layers 12 and 13 are formed of a compound oxide material of a primary metal oxide of indium oxide with a secondary metal oxide or oxides whose metallic elements have substantially no solid solubility in silver. The first and second transparent oxide thin layers 12 and 13 may not be necessarily formed of the identical compound oxide material, but it is very convenient in the manufacture thereof to form them from the same compound oxide material.

In the present invention, the metallic element which has substantially no solid solubility in silver refers to a metallic element which forms solid solubility in silver, in an amount of no more than 10 atomic percent at room temperature (25° C.). Such a metallic element includes a high melting point transition metal such as titanium (Ti), zirconium (Zr), tantalum (Ta) or niobium (Nb), a lanthanide element such as cerium (Ce), a semi-metal such as bismuth (Bi), germanium (Ge) or silicon (Si), and chromium (Cr). These metallic elements may be utilized singly or in combination of two or more of these.

Although the present invention should not be bound by any theory, it is believed that when indium oxide added with the secondary metal oxide whose metallic element has substantially no solid solubility in silver is applied on each surface of the silver-based thin layer 11, the formation of solid solution of the silver in the silver-based thin layer 11 with the indium element can be prevented, and the migration of the silver to the both transparent oxide layers 12 and 13 can be inhibited, thereby increasing the stability with time and the moisture resistance of the multilayered conductive film.

The amount of the secondary metal oxide in the transparent oxide thin layer 12 or 13 is preferably such that the metallic portion thereof, i.e., the metallic element which has substantially no solid solubility in silver, occupies 5 atomic percent or more of the total atomic amount of the indium portion of the primary metal oxide and the metallic element of the secondary metal oxide. If the amount of the metallic element having substantially no solid solubility in silver is less than 5 atomic percent, the addition effect of the secondary metal oxide tends to be insufficient. The amount of the metallic element having substantially no solid solubility in silver is more preferably 10 atomic percent or more of the total atomic amount with the indium element.

On the other hand, the amount of the secondary metal oxide is preferably such that the metallic portion thereof, i.e., the metallic element which has substantially no solid solubility in silver, occupies 50 atomic percent or less of the total atomic amount of the indium element of the primary metal oxide material and the metallic element of the secondary metal oxide. If the amount of the metallic element having substantially no solid solubility in silver is more than 50 atomic percent, the resultant oxide thin layer tends to be lowered in adhesivity with the silver-based thin layer 11. In addition, if the metallic element of the secondary metal oxide is present in such a large amount, a target used for the film formation thereof becomes difficult to process, and tends to crack, and the film formation rate tends to be lowered, as will be explained later. The amount of the metallic element having substantially no solid solubility in silver is more preferably 40 atomic percent or less, and most preferably 30 atomic percent or less of the total atomic amount with the indium element.

Each of the first and second transparent oxide thin layers 12 and 13 preferably has a thickness of 30 to 100 nm. If the thickness exceeds 100 nm, the reflected light at the surface of the oxide thin layer and the reflected light at the surface of the silver-based thin layer 11 tend to interfere with each other, creating color.

The silver-based thin layer 11 preferably contains a different element which prevents the silver migration in order to prevent the silver from migrating, though it may be formed of silver alone. Examples of such a different element include aluminum (Al), copper (Cu), nickel (Ni), cadmium (Cd), gold (Au), zinc (Zn), magnesium (Mg), tin (Sn), indium (In), titanium (Ti), zirconium (Zr), cerium (Ce), silicon (Si), lead (Pb), and palladium (Pd). Of these elements, aluminum, copper, nickel, cadmium, gold, zinc and magnesium also have an effect of increasing the conductivity, while tin, indium, titanium, zirconium, cerium and silicon also have an effect of increasing adhesivity with the oxide thin layers 12 and 13. Gold is most preferred because it contributes to the stabilization of the silver-based thin layer 11.

Such a different element is contained in the silver-based thin layer 11 preferably in an amount of 0.1 to 3 atomic percent. If the amount is less than 0.1 atomic percent, the effect of preventing the silver migration tends to be insufficient, while the amount exceeds 3 atomic percent, the silver-based thin layer 11 tends to be lowered in electrical conductivity. In particular, gold tends to leave an etching residue when the amount exceeds 3 atomic percent. Gold is contained more preferably in an amount of 2.5 atomic percent or less.

The silver-based thin layer 11 preferably has a thickness of 2 nm or more, in order to ensure a satisfactory conductivity. In addition, a suitable thickness of the silver-base thin layer 11 also varies depending on whether the multilayered conductive film 10 is used as a transparent electrode or as a light-reflecting electrode.

FIGS. 5 and 6 show the changes in the reflectance R and transmittance T of a multilayered conductive film when the thickness of a silver-based thin layer 11 was changed in the multilayered conductive film formed on a glass substrate (refractive index n of 1.5) as the substrate SUB. The conductive film was constituted by the silver-based thin layer 11, and the transparent oxide thin layers 12 and 13 sandwiching the silver-based thin layer 11 and each having a refractive index n of 2.3 and a thickness of 40 nm. FIG. 5 shows the results when the thickness of the silver-based thin layer 11 is 10 nm (curve a), 15 nm (curve b), 20 nm (curve c), or 50 nm (curve d), while FIG. 6 shows the results when the thickness of the silver-based thin layer 11 is 50 nm (curve d), 75 nm (curve e), 100 nm (curve f), or 200 nm (curve g). In FIGS. 5 and 6, the symbol T in the brackets put adjacent to the curve-designating mark represents the transmittance, while the symbol R in the brackets put adjacent to the curve-designating mark represents the reflectance.

As can be seen from FIG. 5, when the thickness of the silver-based thin layer 11 is 20 nm or less, the multilayered conductive film behaves mainly in light transmitting mode, exhibiting a transmittance of about 80% or more. Further, as can be seen from FIG. 6, when the thickness of the silver-based thin layer 11 is 50 nm or more, the multilayered conductive film behaves mainly in light-reflecting mode, exhibiting a reflectance of about 80% or more. In particular, when the thickness of the silver-based thin layer 11 is 75 nm or more, the reflectance of the multilayered conductive film is saturated, exhibiting a transmittance of about 0%, and the reflectance is completely saturated when the thickness is 200 nm.

Returning to FIG. 1, the multilayered conductive film 10 of the present invention can be prepared on a suitable substrate SUB by using a suitable deposition technique such as vapor deposition, sputtering, ion plating or the like technique.

In particular, the transparent oxide thin layers 12 and 13 are formed preferably by sputtering technique, more preferably by a direct current sputtering technique such as DC-sputtering or RF-DC sputtering, especially in the case where the silver-based thin layer 11 already exists when the transparent oxide thin layer is to be formed. High frequency sputtering technique undesirably heats the substrate SUB, causing the migration of the silver contained in the silver-based thin layer 11 to cause the silver-based thin layer 11 to be deformed into spherical form (silver agglomeration). It also generates oxygen plasma, also leading to the silver migration accompanied by the agglomeration of the silver-based thin layer 11.

Especially in the case where the silver-based thin layer 11 exists, the temperature of the substrate SUB is preferably set at a temperature as low as possible, more preferably at 180° C. or less, and most preferably at 120° C. or less, in order to prevent the silver in the silver-based thin layer from migrating. The temperature may be room temperature.

The sputtering apparatus used is preferably freed of moisture within its interior, in order to prevent the migration of silver contained in the silver-based thin layer 11.

Before preparing the multilayered conductive film 10 on the substrate SUB, the substrate SUB is cleaned. This cleaning may be effected by ion bombardment, reverse sputtering, ashing, UV cleaning, glow discharge treatment or the like technique, depending on the material which forms the substrate SUB.

The target used for depositing the transparent oxide thin layers 12 and 13 by sputtering technique or the like may be prepared by mixing powder of the primary metal oxide, i.e., indium oxide, with powder of the secondary metal oxide, i.e., the oxide of the metallic element having substantially no solid solubility in silver, and adding thereto a binder such as paraffin, a dispersing agent, and a solvent (usually, water) as desired. The resultant mixed oxide powders are mixed and pulverized in a pulverizing and mixing apparatus, preferably until the mixed oxide powders have a particle size of 2 μm or less, usually for 10 to 40 hours. The resultant fine powdery mixture is shaped or formed, preferably under a pressure of 50 to 200 kg/cm$^2$, which is then baked in an oxygen atmosphere. By the baking, unwanted components such as the binder and the dispersing agent are removed, and a dense sintered product can be obtained. The baking temperature is preferably 1,000° C. or more, in order to obtain a more dense sintered product. The baking temperature is more preferably 1,200° to 1,800° C. When the baking temperature exceeds 1,800° C., the secondary metal oxide melts, tending to cause an undesired reaction with the silver-based thin layer 11, thus lowering the conductivity of the multilayered conductive film and the transmissivity of the transparent oxide thin layer.

The compound oxide target thus obtained may be ground by a grinder, or cut by a diamond cutter, if its shape is inappropriate.

The composition of the compound oxide target is set at the same composition of the desired transparent oxide thin layer 12, 13 to be formed. In other words, the transparent oxide thin layer of the same composition as that of the target can be obtained. A small amount of an oxide of an element such as tin, magnesium, zinc, gallium, aluminum, silicon, germanium, antimony, bismuth or titanium may be added to the target to adjust the conductivity, density, and strength of the target. These additives may be introduced into the transparent oxide thin layer 12, 13 formed, and are thus added in a small amount not to adversely affect the transparent oxide thin layers 12 and 13.

The silver-based thin layer 11 is preferably prepared by direct sputtering technique, because the direct sputtering ensures a high film formation rate, and can be effected in the same apparatus used for forming the transparent oxide thin layers 12 and 13, which allows a continuous film formation.

The target used to depositing the silver-based thin layer 11 by sputtering technique is a target formed of silver alone, or a target containing silver and the different element which prevents the silver migration as explained earlier. The target containing silver and the different element is preferably in the form of an alloy of silver with the different element, though the different element may be in the form of chips embedded in silver. Again, the composition of the silver-based target is the same as that of the desired silver-based thin layer 11 to be formed.

Under the conditions mentioned above, the transparent oxide thin layer 12, the silver-based thin layer 11 and the transparent oxide thin layer 13 are sequentially formed on the substrate SUB. The resultant multilayered film is preferably subjected to an annealing treatment at a temperature of 200° C. or more. The annealing treatment increases the conductivity of the multilayered film.

The transparent oxide thin layers 12 and 13 and the silver-based thin layer 11 can be preferably patterned by an etching treatment with a nitric acid-based etchant. For example, after the multilayered conductive film 10 of the invention is formed on the substrate SUB, a usual resist is coated on the uppermost transparent oxide thin layer 13, and the resist film is patterned into a desired pattern, for example, an electrode pattern. The multilayered conductive film can be patterned into the desired pattern with the three thin layers positionally aligned with each other by etching the portions exposed from the resist pattern with a nitric acid-based etchant.

As the nitric acid-based etchant, a mixed acid of nitric acid added with the other acid such as hydrochloric acid, sulfuric acid or acetic acid may be used, though nitric acid alone may also be used. The etchant is preferably a mixed acid of sulfuric acid with nitric acid. Sulfuric acid preferentially etches the transparent oxide thin layers 12 and 13, while nitric acid preferentially etches the silver-based thin layer 11. In the mixed acid of sulfuric acid with nitric acid, it is preferred that the concentration of sulfuric acid be higher than that of nitric acid. By this, the etched amounts of the three thin layers become the same, ensuring that the patterns of the three thin layers are aligned with each other, although the etching rate of the transparent oxide thin layers is different from that of the silver-based thin layer. A mixed acid of sulfuric acid and nitric acid in a weight ratio of 100:0.05 to 100:5 is preferably used. To the etchant, a sulfate salt such as ammonium sulfate, ammonium peroxysulfate or potassium sulfate, a nitrate salt such as ammonium nitrate or ammonium cerium nitrate, a chloride such as sodium chloride or potassium chloride, an oxidizing agent such as chromium oxide, cerium oxide or hydrogen peroxide, and the other additive such as acetic acid, selenic acid, an alcohol or a surfactant may be added as desired. The etching may be effected at a temperature of 30° C. for 40 to 60 seconds. By this etching treatment, an electrode pattern having a fine width portion of a minimum width of 20 to 50 μm can be formed with a side-etched width of 0 to 4 μm, without generating disorder of the pattern.

Figure 2:
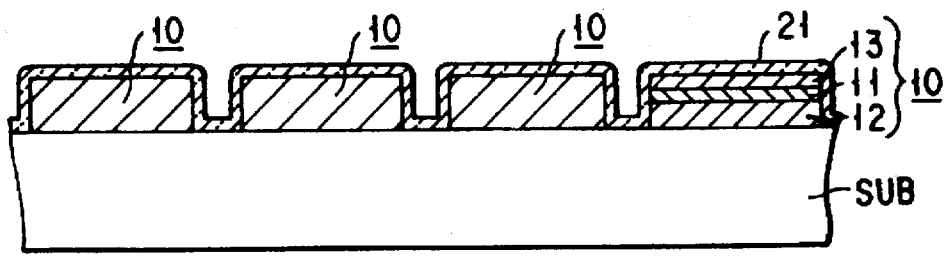
FIG. 2 shows a cross-sectional view of a multilayered conductive film of the present invention which is protected by a protective film.

In the case where the multilayered conductive film is etched in this way, it is preferred that a moisture-resistant transparent thin layer be formed to protect the etched sides from deteriorating due to moisture. FIG. 2 shows the multilayered conductive film of the invention in the form protected with an electrically insulative, moisture-resistant transparent thin layer 21. In FIG. 2, each multilayered conductive film 10 formed on the substrate SUB is formed into a stripe extending in a direction normal to the plane of the drawing sheet, and the conductive films 10, including the etched sides thereof, are entirely covered with a moisture-resistant transparent thin layer 21.

The protective layer 21 is preferably formed of an oxide of such a metal as silicon, titanium, zirconium or tantalum because of its high moisture resistance. Silicon oxide is most preferred.

The protective layer 21 preferably has a thickness of 20 nm or more in total with the thickness of the transparent oxide thin layer 13. In addition, the protective layer 21 preferably has a thickness of 100 nm or less in total with the thickness of the transparent oxide thin layer 13. When the total thickness of the protective layer 21 and the transparent oxide layer 13 exceeds 100 nm, the reflected light at the surface of the protective layer 21 and the reflected light at the surface of the silver-based thin layer 11 interfere with each other, creating color. The protective layer 21 is usually formed to a thickness of 20 to 70 nm. The protective layer 21 can be formed by the same film formation technique as that used for forming the transparent oxide thin layers 12 and 13. When the protective layer 21 is formed, the above-mentioned annealing treatment conducted for improving the conductivity is carried out after the formation of the protective layer 21.

The multilayered conductive film according to the present invention may be utilized as a transparent electrode and/or light-reflecting electrode for various liquid crystal display devices. Meanwhile, FIG. 1 also shows a basic structure of a transparent electrode substrate when the multilayered conductive film 10 is transparent as explained below with reference to FIGS. 3 and 4, while it also shows a light-reflecting electrode substrate when the multilayered conductive film 10 is light-reflective as explained below with reference to FIG. 4.

Figure 3:
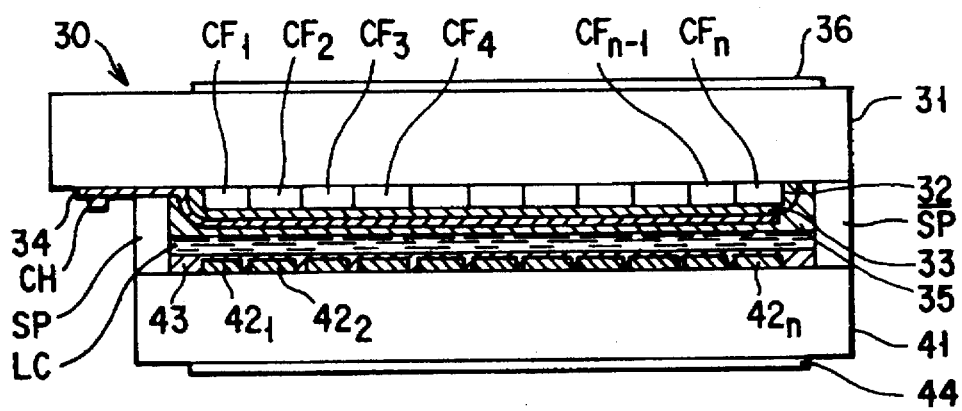
FIG. 3 shows a transparent type liquid crystal display device to which a multilayered conductive film of the present invention may be applied.

FIG. 3 is a schematic cross-sectional view showing an example of transparent type liquid crystal display devices. The transparent type liquid crystal display device 30 shown in FIG. 3 has a pair of transparent substrates 31 and 41 which are arranged opposite to each other and spaced apart from each other at a predetermined distance defined by a spacer SP. The transparent substrate 31 is positioned at the observer side, while the transparent substrate 41 is positioned at the rear side.

On that surface of the observer-side substrate 31 that faces the substrate 41, a color filter layer 32 constituted by a group of color filters $CF_1$–$CF_n$ (sometimes hereinafter collectively referred to as color filters CF), which color the light transmitting therethrough in red, green or blue, is formed, on which a protective layer 33 is formed. Usually, at the sites (inter-pixel sites) between the pixels, a light-shielding film (not shown) is formed to prevent the light from transmitting through the inter-pixel sites. On the protective layer 33, a plurality of stripe-shaped transparent electrodes 34 (in the Figure, only one can be seen) are formed spaced apart from each other at a predetermined distance. On the electrodes 34, an orientation film 35 is formed. An IC chip CH for driving the device is formed on the portion of the electrodes 34 that extends from the liquid crystal cell on the transparent substrate 31.

On the other surface of the transparent substrate 31, a polarizing film 36 is formed.

On that surface of the rear-side substrate 41 that faces the substrate 31, a plurality of stripe-shaped transparent electrodes $42_1$–$42_n$ (sometimes hereinafter collectively referred to as transparent electrodes 42) are formed spaced apart from each other at a predetermined distance, and extend in a direction normal to the direction in which the transparent electrodes 34 extend. On the transparent electrodes 42, an orientation film 43 is formed.

On the other surface of the transparent substrate 41, a polarizing film 44 is formed.

The transparent substrates 31 and 41 are formed of light-transmitting materials. Examples of such materials include a glass substrate, a plastic substrate, and a plastic film (including a polarizing film, a phase differential film, and a lens sheet, and also including those having a gas barrier layer or a hard coat layer of a hard synthetic resin).

In the space between the substrates 31 and 41, a liquid crystal material LC is sealed. Any liquid crystal material may be used depending on the operation mode, including nematic liquid crystals, ferroelectric liquid crystals, semi-ferromagnetic liquid crystals, cholesteric liquid crystals, smectic liquid crystals, and homeotropic liquid crystals, each of which may be dispersed in a polymer matrix. The operation mode may be twisted nematic (TN), super-twisted nematic (STN), electrically controlled birefringence (ECB), birefringence twisted nematic (BTN), optically compensated bend (OCB), or guest-host mode. The liquid crystal material LC preferably has a refractive index (e.g., 1.5 to 1.6) close to the refractive index (usually, about 1.5) of the transparent substrate, at the time of light-transmitting (at the time of turning off of the voltage in the case of the TN or STN mode of the normally white type). When the liquid crystal material has such a refractive index, the light incident upon the liquid crystal material can transmit therethrough without refracting or reflecting.

Figure 4:
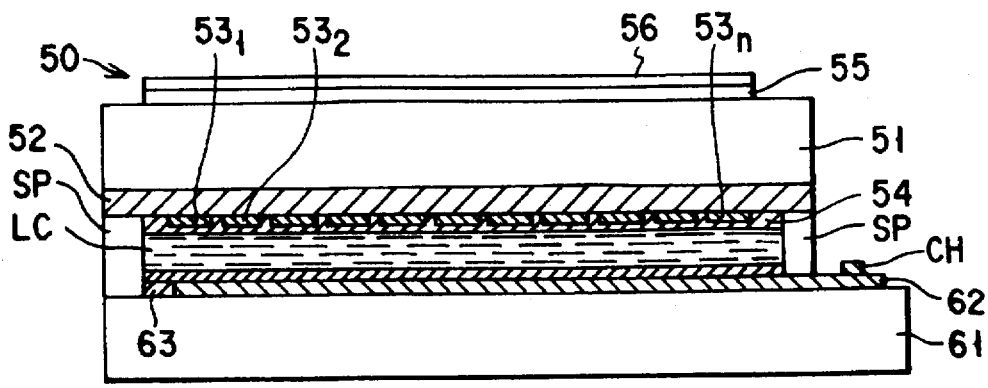
FIG. 4 shows a reflective type liquid crystal display device to which a multilayered conductive film of the present invention may be applied.

FIG. 4 is a schematic cross-sectional view showing an example of a reflective type liquid crystal display devices. The reflective type liquid crystal display device 50 shown in FIG. 4 has a pair of electrodes 51 and 61, which are arranged opposite to each other and spaced apart from each other at a predetermined distance defined by a spacer SP. The substrate 51 is positioned at the observer side and is transparent, while the substrate 61 is positioned at the rear side and may be either transparent or non-transparent.

On that surface of the observer-side substrate 51 that faces the substrate 61, a plurality of stripe-shaped transparent electrodes $53_1$–$53_n$ (sometimes hereinafter collectively referred to as transparent electrodes 53) are formed spaced apart from each other at a predetermined distance and through a light-scattering film 52. On the transparent electrodes 53, an orientation film 54 is formed.

On the other surface of the transparent substrate 51, a polarizing film 55 is formed, on which a light-scattering film 56 is formed.

The transparent substrate 51 may be formed of the same material as the transparent substrates 31 and 41 in the liquid crystal display device shown in FIG. 3.

On that surface of the rear-side substrate 61 that faces the substrate 51, a plurality of stripe-shaped light-reflecting electrodes 62 (only one can be seen in the Figure) are formed spaced apart from each other at a predetermined distance, and extend in a direction normal to the direction in which the transparent electrodes 53 extend. On the electrodes 62, an orientation film 63 is formed. An IC chip CH for driving the device is formed on the portion of the light-reflecting electrode 62 that extends from the liquid crystal cell on the transparent substrate 61.

The rear-side substrate 61 may be made of the same material as the transparent substrates 31 and 41 when it is transparent, but the substrate 61 is preferably rendered non-transparent by imparting irregularities thereto, or by forming a light-scattering layer thereon. The light-scattering layer may be formed of a material in which a transparent powder is dispersed in a synthetic resin, the powder having a refractive index different from the refractive index (usually, 1.3 to 1.7) of the resin. The transparent powder has a particle size corresponding to more than the wavelength of the light. Examples of the transparent powder include particulate resin powder (e.g., microcapsules of a fluororesin), and an inorganic powder such as titanium oxide, zirconium oxide, lead oxide, aluminum oxide, silicon oxide, magnesium oxide, zinc oxide, thorium oxide, cerium oxide, calcium fluoride or magnesium fluoride. Cerium oxide, calcium fluoride and magnesium fluoride are particularly preferred.

In the space between the substrates 51 and 61, a liquid crystal material LC similar to that described above with reference to the transparent type liquid crystal display device 30 shown in FIG. 3 is sealed. The operation mode may be TN, STN, BTN, OCB, or guest-host mode. Likewise, the liquid crystal material LC preferably has a refractive index (e.g., 1.5 to 1.6) close to the refractive index (usually, about 1.5) of the transparent substrate, at the time of light-transmitting (at the time of turning off of the voltage in the case of the TN or STN mode of the normally white type). When the liquid crystal material has such a refractive index, the light incident upon the liquid crystal material can transmit therethrough without refracting or reflecting.

The multilayered conductive film 10 of the present invention, which may either be protected or not protected by the protective layer 21, can be used as the transparent electrode 34, 42 and/or 53 in any of the display devices shown in FIGS. 3 and 4. In this case, since the multilayered conductive film 10 must be transparent, the silver-based thin layer 11 preferably has a thickness of 20 nm or less as explained above.

Since the color filters CF and the transparent substrate 31, 41 or 51 have a refractive index of about 1.5 to 1.6, the silver-based thin layer 11 more preferably has a thickness of 17 nm or less, most preferably has a thickness of 4 to 17 nm in order to render the refractive index of the multilayered conductive film 10 close thereto, thereby lowering the reflectance and increasing the transmissivity.

FIG. 7 shows the results of the simulation of the transmittance (T) and reflectance (R) of a multilayered conductive film having a structure similar to the multilayered conductive film explained with reference to FIG. 5, but wherein the refractive index of the transparent oxide thin layers 12 and 13 was 2.3, the thickness of the first transparent oxide thin layer 12 was 37 nm, the thickness of the second transparent oxide thin layer 13 was 37 nm, the thickness of an orientation film formed thereon was 40 nm, and the refractive index of the liquid crystal was 1.5, and wherein the thickness of the silver-based thin layer 11 was changed. In FIG. 5, curve a relates to the case where the thickness of the silver-based thin layer 11 was 9 nm, curve b relates to the case where the thickness of the silver-based thin layer 11 was 11 nm, curve c relates to the case where the thickness of the silver-based thin layer 11 was 13 nm, curve d relates to the case where the thickness of the silver-based thin layer 11 was 15 nm, and curve e relates to the case where the thickness of the silver-based thin layer 11 was 17 nm. In FIG. 7, the symbol T in the brackets put adjacent to the curve-designating mark represents the transmittance, while the symbol R in the brackets put adjacent to the curve-designating mark represents the reflectance. As can be seen from FIG. 7, when the thickness of the silver-based thin layer is 17 nm or less, the transmittance is 90% or more, and the reflectance is correspondingly low, while the thickness of the silver-based thin layer is more than 17 nm, the transmittance is less than 90% at a wavelength of 550 nm. Meanwhile, it is not preferred that the thickness of the silver-based thin layer 11 is less than 4 nm because, in such a case, the silver-based layer tends not to become continuous, but to become island-like, when it is formed.

In addition, it is preferred that the silver-based thin layer 11 be formed of an alloy of silver with 0.1 to 3 atomic percent of copper and/or gold. By the addition of copper and/or gold in such an amount, the transmissivity at the shorter wavelength is increased.

FIG. 8 shows the results obtained when a silver thin layer added with 0.1 atomic percent of copper ($AgCu_{0.1}$), a silver thin layer added with 3 atomic percent of copper ($AgCu_3$), or a silver thin layer (Ag) was formed, and the transmittance T of the silver-based thin layers was measured. Each silver-based thin layer had a thickness of 40 nm. As can be seen from FIG. 8, the addition of 0.1 to 3 atomic percent of copper to silver significantly increases the transmissivity at the shorter wavelength as compared to silver alone.

Figure 9:
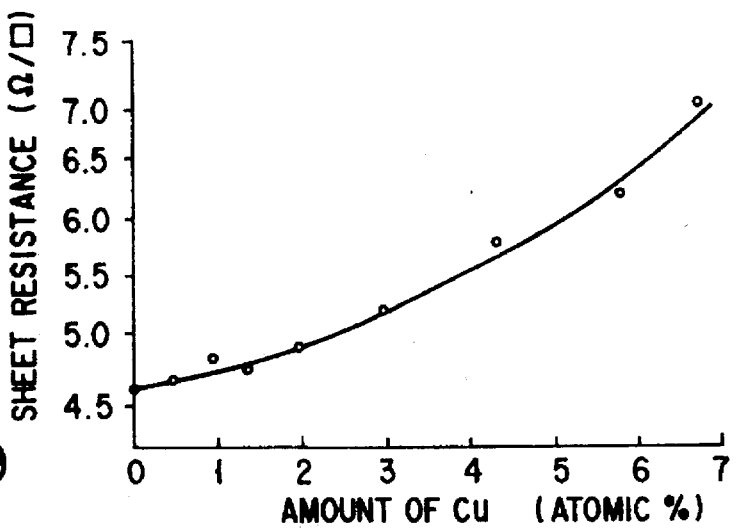
FIG. 9 is a graph showing the relationship of the amount of copper added to the silver-based layer with the sheet resistance of the multilayered conductive film.

FIG. 9 shows the sheet resistance of silver-based thin layer wherein a varying amount (atomic percent) of copper was added to silver. As shown in FIG. 9, the sheet resistance increases as the amount or concentration of copper increases. However, when the concentration of copper was 3 atomic percent, the silver-copper alloy exhibited a sheet resistance of about 5Ω/square (□) when the thickness was 10 nm, and a sheet resistance of about 3Ω/square when the thickness was 15 nm, indicating that when copper is added in such an amount, the electrical conductivity is sufficient.

Similar results to those shown in FIGS. 8 and 9 were obtained when gold was used instead of copper.

Further, it is preferred that the transparent oxide thin layers 12 and 13 have a refractive index of 2.1 or more in order to increase the transmissivity at the longer wavelength. To have such a high refractive index, it is preferred that an oxide of cerium, titanium, zirconium, hafnium and/or tantalum be used as the secondary metal oxide constituting the transparent oxide thin layers. The oxides of cerium and titanium are particularly preferred as such a secondary metal oxide. For example, the refractive indices of transparent oxide thin layers containing 20, 30, and 40 atomic percent of cerium are 2.17, 2.24, and 2.30, respectively. When the metal atoms in the secondary metal oxide are contained in an amount of 10 atomic percent or more, the transparent oxide thin layer becomes amorphous or amorphous-like. Thus, the oxide thin layer can be etched with good precision, and the plane of polarization can be maintained since the thin layer becomes optically isotropic.

Figure 10:
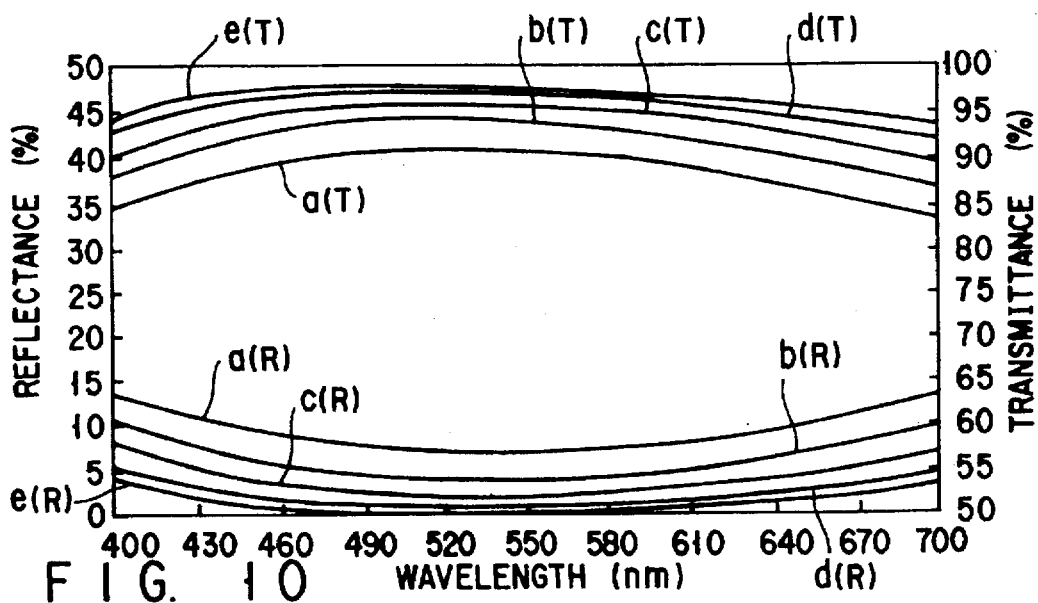
FIG. 10 is a graph showing the relationship of the refractive index of the transparent oxide layer with the transmittance and the reflectance of the multilayered conductive film.

FIG. 10 shows the calculated relationships of the refractive index of the transparent oxide thin layer in the multilayered conductive film of the invention with the transmittance and the reflectance, where the multilayered conductive film was assumed to contact the liquid crystal material (assumed to have a refractive index of 1.5) through a polyimide orientation film having a thickness of 40 nm. In this case, the thickness of the transparent oxide thin layer was optimized. Curve a relates to a refractive index of 2.0, curve b related to a refractive index of 2.1, curve c relates to a refractive index of 2.2, curve d relates to a refractive index of 2.3, and curve e relates to a refractive index of 2.4. In FIG. 10, the symbol T in the brackets put adjacent to the curve-designating mark represents the transmittance, while the symbol R in the brackets put adjacent to the curve-designating mark represents the reflectance. As can be seen from FIG. 10, when the refractive index of the transparent oxide thin layer is 2.1 or more, the transmittance of the multilayered conductive film is increased, and the reflectance is lowered correspondingly.

When the multilayered conductive film 10 is utilized as a light-reflecting electrode 62 in the reflective type liquid crystal display device shown in FIG. 4, the multilayered conductive film 10 is preferred to have a silver-based thin layer 11 with a thickness of 50 nm or more, as explained above. In addition, the silver-based thin layer 11 is preferred to have a thickness of 200 nm or less as explained with reference to FIG. 6. The other features are the same as those explained with reference to FIGS. 1, 2 and 4.

Although the multilayered conductive film of the invention has been described mainly with regard to its application to liquid crystal display devices, it should be noted that the multilayered conductive film of the invention can be used as a transparent electrode or a light-reflecting electrode for solar cells.

The present invention will be described below by way of its Examples.

EXAMPLE 1

In this Example, a transparent electrode substrate provided with a multilayered conductive film according to the invention was fabricated.

The transparent electrode substrate had the structure as shown in FIG. 1, and was provided with a multilayered conductive film 10 consisting of a transparent oxide thin layer 12 having a thickness of 35 nm, a silver thin layer 11 having a thickness of 14 nm and a transparent oxide thin layer 13 having a thickness of 35 nm, which were sequentially deposited on a grass substrate SUB having a thickness of 0.7 mm.

Both of the transparent oxide thin layers 12 and 13 were formed of a compound oxide material of indium oxide ($In_2O_3$) with titanium oxide ($TiO_2$), wherein the amount of the titanium oxide was such that the titanium atoms amounted to 20 atomic percent of the indium atoms, in terms of the metallic elements without counting the oxygen atoms.

The transparent multilayered conductive film was prepared as follows.

<Preparation of a sputtering target for depositing the transparent oxide thin layers>

A mixture of indium oxide powder and titanium oxide powder each having an average particle size of about 2 μm the predetermined amounts was added with a small amount of paraffin as a binder, and was pulverized and mixed in a wet ball mill for 24 hours.

The mixed powder was filled in a predetermined mold, and formed into a predetermined shape, which was then dried to remove the water. The molded mass was placed in an electric furnace, and baked in an oxygen atmosphere at 1550° C. for 10 hours to remove the paraffin and sinter the molded mass. The sintered product was ground by a plane grinder, and shaped by a diamond cutter. Thus, the desired compound oxide target was obtained.

<Preparation of a sputtering target for depositing the silver thin layer>

Silver was molten in a melting furnace in vacuum, cast into a mold cooled with water, and cooled for 3 hours. The resultant cast mass was ground by a plane grinder to shape the edge planes. Thus, the desired silver target was obtained.

<Cleaning of the glass substrate>

The surface of the glass substrate was sequentially cleaned with an alkali surfactant and water. Then, the substrate was placed in a vacuum chamber of a DC magnetron sputtering apparatus, and subjected to a plasma treatment called reverse sputtering to further clean it.

<Fabrication of the multilayered conductive film>

Without removing the glass substrate from the vacuum chamber, and while the substrate was maintained at room temperature, the transparent oxide thin layer was formed on the glass substrate, using the compound oxide target, then, the silver thin layer 11 was formed, using the silver target, and finally, the transparent oxide thin layer 13 was formed, again using the compound oxide target.

Thereafter, a resist film of the predetermined electrode pattern was formed on the transparent oxide thin layer 13, and the portions exposed from the resist film was etched into the electrode pattern at 30° C. for about 40 seconds, using a mixed acid etchant containing 60.4% by weight of sulfuric acid and 3% by weight of nitric acid. The electrode pattern with the deposited three thin layers aligned with each other was obtained. Then, the electrodes were annealed at 220° C. for an hour. Thus, the transparent multilayered conductive films were obtained.

The transparent multilayered conductive film thus obtained exhibited a sheet resistance of about 2.7Ω/square. The visible light transmittance of the film is shown in Table 1 below.

For comparison, a transparent three-layered conductive film was prepared by using IO thin layers, instead of the transparent oxide thin layers 12 and 13. The visible light transmittance of the film is shown also in Table 1.

The transparent electrode substrate of the invention obtained above was stored in air for 8 weeks. No changes in the outer appearance of the multilayered conductive film 10 were observed. In contrast, in the three-layered conductive film wherein IO thin layers were applied instead of the transparent thin layers noted above, many stains appeared after storage in air for 2 weeks.

As described above, it was confirmed that the transparent multilayered conductive film prepared in this Example has a high visible light transmittance at the longer wavelength, a high and uniform transmittance over the entire visible regions, a very high conductivity, and superior moisture resistance, as compared to the prior art three-layered film.

EXAMPLE 2

In this Example, a transparent electrode substrate was fabricated in the same manner as in Example 1, except that the transparent oxide thin layers 12 and 13 were formed of a compound oxide material of indium oxide with titanium oxide and cerium oxide ($CeO_2$). The amount of the titanium oxide was such that the titanium atoms amounted to 16 atomic percent of the indium atoms, and the amount of the cerium oxide was such that the cerium atoms amounted to 4 atomic percent of the indium atoms, in terms of the metallic elements without counting the oxygen atoms.

The obtained transparent multilayered conductive film exhibited a sheet resistance of about 2.7Ω/square. The visible light transmittance of it is also shown in Table 1 below.

The transparent electrode substrate thus obtained above was stored in air for 8 weeks. No changes in the outer appearance of the multilayered conductive film 10 were observed.

TABLE 1

| | Visible Light Transmittance (%) | | | | | |
|---|---|---|---|---|---|---|
| | 450 nm | 500 nm | 550 nm | 600 nm | 650 nm | 700 nm |
| Example 1 | 95.4 | 97.5 | 95.8 | 93.0 | 89.5 | 81.0 |
| Example 2 | 95.3 | 97.4 | 95.5 | 93.1 | 89.7 | 81.4 |
| Comparative Example | 96.2 | 97.0 | 95.1 | 90.4 | 82.9 | 73.7 |

EXAMPLE 3

A transparent multilayered conductive film was formed on a glass substrate in the same manner as in Example 1, except that the transparent oxide thin layer 12 and 13 each had a thickness of 39 nm, without changing the compositions thereof, and the silver-based thin layer was formed of a silver-copper alloy containing 0.4 atomic percent of copper. The multilayered film was then annealed at 270° C. for an hour.

The transparent multilayered conductive film thus obtained exhibited a sheet resistance of about 2.8Ω/square. The visible light transmittance thereof is shown in Table 2 below.

TABLE 2

| | Visible Light Transmittance (%) | | | | | | |
|---|---|---|---|---|---|---|---|
| | Wavelength | | | | | | |
| | 400 nm | 450 nm | 500 nm | 550 nm | 600 nm | 650 nm | 700 nm |
| Example 3 | 81.9 | 93.9 | 97.0 | 97.5 | 95.6 | 92.6 | 85.8 |

As described above, it was confirmed that the transparent multilayered conductive film prepared in this Example has a high visible light transmittance at the shorter wavelength, a uniform transmissivity over the entire visible regions, a very high conductivity, and superior moisture resistance.

EXAMPLE 4

In this Example, a transparent electrode substrate having a multilayered conductive film of the invention was fabricated.

The transparent electrode substrate had the structure as shown in FIG. 1, and was provided with a multilayered conductive film 10 consisting of a transparent oxide thin layer 12 having thickness of 39 nm, a silver alloy thin layer 11 having a thickness of 10 nm and a transparent oxide thin layer 13 having thickness of 39 nm, which were sequentially deposited on a grass substrate SUB having a thickness of 0.7 mm.

Both of the transparent oxide thin layers 12 and 13 were formed of a compound oxide material of indium oxide with titanium oxide and cerium oxide. The amount of the titanium oxide was such that the titanium atoms amounted to 19 atomic percent of the indium atoms, and the amount of the cerium oxide was such that the cerium atoms amounted to 1 atomic percent of the indium atoms, in terms of the metallic elements without counting the oxygen atoms. The silver alloy thin layer 11 was formed of a silver-copper alloy containing 0.3 atomic percent of copper.

The transparent multilayered conductive film 10 was prepared in a manner similar to Example 1, and exhibited a sheet resistance of about 4.6Ω/square after annealed at 270° C. for an hour. The visible light transmittance of the film was measured. The film showed a transmittance as high as 90% or more over the entire visible region, and was confirmed to have a remarkably improved transmittance both at the shorter wavelength of 500 nm or less, and at the longer wavelength of 550 nm or more.

EXAMPLE 5

In this Example, a transparent electrode substrate having a multilayered conductive film of the invention was fabricated.

The transparent electrode substrate had the structure as shown in FIG. 1, and was provided with a multilayered conductive film 10 consisting of a transparent oxide thin layer 12 having thickness of 33 nm, a silver-based thin layer 11 having a thickness of 15 nm and a transparent oxide thin layer 13 having thickness of 34 nm which were sequentially deposited on a grass substrate SUB having a thickness of 0.7 mm.

Both of the transparent oxide thin layers 12 and 13 were formed of a compound oxide material of indium oxide with titanium oxide and cerium oxide. The amount of the cerium oxide was such that the cerium atoms amounted to 30 atomic percent of the indium atoms, in terms of the metallic elements without counting the oxygen atoms. The silver-based thin layer 11 was formed of a silver-gold alloy containing 1.0 atomic percent of gold.

The transparent multilayered conductive film 10 was prepared in a manner similar to Example 1, and annealed at 270° C. for an hour.

Figure 11:
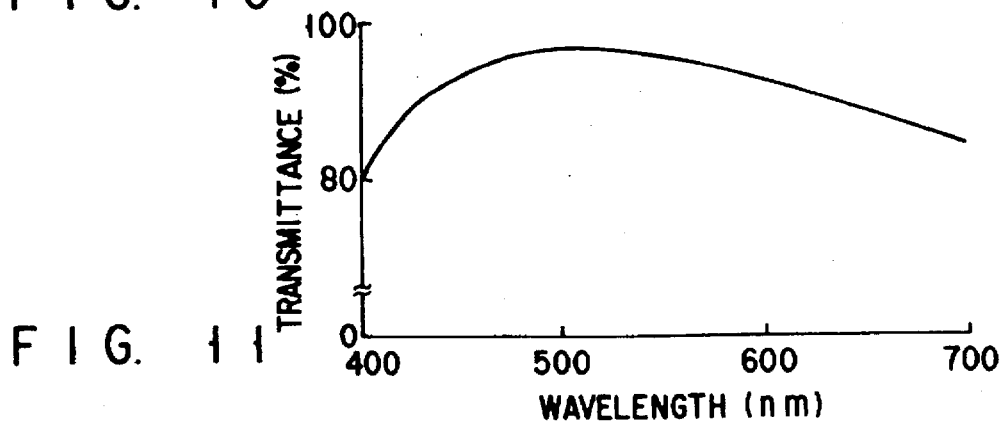
FIG. 11 is a graph showing the transmittance of the multilayered conductive film fabricated in an Example of the invention.

The transparent multilayered conductive film 10 exhibited a sheet resistance of about 2.9Ω/square. The visible light transmittance of the film is shown in FIG. 11.

The patterned transparent multilayered conductive film thus obtained was stored under the conditions of a temperature of 60° C. and a relative humidity of 90% for 500 hours. No changes in the outer appearance of the film were observed. The transparent oxide thin layers was found to have a refractive index of 2.24.

EXAMPLE 6

Transparent multilayered conductive films were fabricated on glass substrates SUB in the same manner as in Example 5, except that the amount of gold in the silver-gold alloy constituting the silver-based thin layer was changed from 0.1 to 4 atomic percent. The sheet resistance and the transmittance at 610 nm of the conductive films is shown in Table 3 below. The sheet resistance and the transmittance were measured after annealing the films at 220° C. for an hour.

TABLE 3

| | Amount of Gold (atomic %) | | | | | | | |
|---|---|---|---|---|---|---|---|---|
| | 0.1 | 0.2 | 0.4 | 0.8 | 1.5 | 2.5 | 4.0 | 0 |
| Sheet Resistance (Ωn) | 2.81 | 2.83 | 2.82 | 2.85 | 3.28 | 4.13 | 4.94 | 2.81 |
| Transmittance (at 610 nm) | 93.0 | 92.8 | 92.5 | 92.5 | 92.4 | 90.7 | 89.2 | 92.6 |

As shown in Table 3, even the transparent multilayered conductive film having a silver-based thin layer formed of a silver-gold alloy containing 4 atomic percent of gold exhibited a sheet resistance as low as 4.9Ω/square. All the conductive films had a transmittance of 90% or more at a wavelength of 545 nm (green). The conductive film having a silver-based thin layer containing 4 atomic percent of gold exhibited slightly lowered transmittance of 89% at a wavelength of 610 nm (red). In view of the transmittance, too, the gold addition of more than 4 atomic percent is not preferred.

The transparent multilayered conductive films thus obtained were stored under the conditions of a temperature of 60° C. and a relative humidity of 90%. After storage for 200 hours, no changes in the outer appearances of all the films were observed, with no stains. After storage for 500 hours, no changes in the outer appearances of the films that contained 0.4 atomic percent or more of gold in the silver-based thin layer, but very fine stains appeared in the conductive films that contained 0.1 atomic percent and 0.2 atomic percent of gold in the silver-based thin layers. However, all the conductive films were excellent in the storage stability, as compared to corresponding multilayered conductive films containing copper instead of gold in the silver alloy thin layers.

EXAMPLE 7

In this Example, a transparent electrode substrate having a multilayered conductive film of the invention was fabricated.

The transparent electrode substrate had the structure as shown in FIG. 1, and was provided with a multilayered conductive film 10 consisting of a transparent oxide thin layer 12 having thickness of 39 nm, a silver-based thin layer 11 having a thickness of 15 nm and a transparent oxide thin layer 13 having thickness of 40 nm which were sequentially deposited on a grass substrate SUB having a thickness of 0.7 mm.

Both of the transparent oxide thin layers 12 and 13 were formed of a compound oxide material of indium oxide with cerium oxide, tin oxide and titanium oxide. The compound oxide material contained 66 atomic percent of indium, 32.5 atomic percent of cerium, 1.0 atomic percent of tin and 0.5 atomic percent of titanium, in terms of the metallic elements without counting the oxygen atoms. The silver-based thin layer 11 was formed of a silver-gold-copper ternary alloy containing 98.4 atomic percent of silver, 0.8 atomic percent of gold and 0.8 atomic percent of copper.

The transparent multilayered conductive film 10 exhibited a sheet resistance of about 2.8Ω/square after annealed at 220° C. for an hour. The transmittance of the film at 550 nm was about 97%.

The transparent multilayered conductive film was stored under the conditions of a temperature of 60° C. and a relative humidity of 95% for 200 hours. It still exhibited good outer appearance with no stains.

Multilayered conductive films whose silver-based thin layers are formed of silver-gold-copper ternary alloys tend to exhibit lower sheet resistivities and improved moisture resistances, as compared to the corresponding multilayered conductive films whose silver-based thin layers are formed of silver-copper binary alloy containing copper in an amount corresponding to the total amount of gold and copper in the ternary alloys. Further, since gold is 100 times higher in cost than silver, the addition of copper may reduce the amount of gold to lower the entire cost.

EXAMPLE 8

In this Example, a transparent electrode substrate having a multilayered conductive film of the invention was fabricated.

The transparent electrode substrate had the structure as shown in FIG. 2, and was provided with a plurality of multilayered conductive films 10 each consisting of a transparent oxide thin layer 12 having thickness of 40 nm, a silver thin layer 11 having a thickness of 14 nm and a transparent oxide thin layer 13 having a thickness of 40 nm which were aligned with each other and sequentially deposited on a grass substrate SUB having a thickness of 0.7 mm. All the multilayered conductive films 10 were uniformly covered with an electrically insulative, moisture-resistant transparent film 21 having a thickness of 40 nm.

Both of the transparent oxide thin layers 12 and 13 were formed of a compound oxide material of indium oxide with cerium oxide. The amount of the cerium oxide was such that the cerium atoms were contained in an amount of 10 atomic percent in the compound oxide material, in terms of the metallic elements without counting the oxygen atoms. The transparent film 21 was formed of silicon oxide ($SiO_2$). The transparent multilayered conductive films (transparent electrodes) 10 had a stripe shape with a width of 200 μm, and were arranged at a pitch of 210 μm with a distance of 10 μm.

The transparent electrode substrate was prepared in a manner similar to that in Example 1 by sequentially forming the transparent oxide thin layer 12, the silver thin layer 11 and the transparent thin layer 13 on a glass substrate SUB, etching the obtained three-layered structure into the stripe pattern, forming the moisture-resistant transparent film 21 and annealing the structure at 200° C. for 30 minutes. Each transparent electrode had a fine width portion with a width of 20 nm or less.

The transparent electrodes thus obtained exhibited a sheet resistance of about 2.8Ω/square.

The transparent electrode substrate was stored in air for one month. No changes in the outer appearances of the electrodes were observed.

For comparison, a silver thin layer was formed on a glass substrate, which was then stored in air for one month. Then, the surface of the silver layer was changed in color, and many stains were observed.

As described above, according to the present invention, deterioration with time of the silver-based thin layer is prevented, and the storage stability is increased. Therefore, a liquid crystal display device, for example, can be stably fabricated, without creating display defects caused by sulfur compound and moisture in air.

EXAMPLE 9

In this Example, a transparent type liquid crystal display device as shown in FIG. 3 was fabricated. The transparent electrodes $42_1$ to $42_n$ each had a stripe shape with a width of 100 μm, and arranged at a pitch of 110 μm. The transparent electrodes 34 had a stripe shape with a width of 320 μm. The electrodes 34 were arranged at a pitch of 330 μm, and extended on the color filters CF in a direction normal to the direction in which the transparent electrodes 42 extended. Each transparent electrode had a fine width portion with a width of 20 nm or less.

The transparent electrodes 34 and 42 were each comprised of the transparent oxide thin layer 12 having a thickness of 38 nm, the silver-based thin layer 11 having a thickness of 14 nm and the transparent oxide thin layer 13 having a thickness of 41 nm.

The transparent oxide thin layers 12 and 13 had a refractive index of 2.2, and were each formed of a compound oxide material of indium oxide with cerium oxide, in which the amount of the cerium oxide was such that the cerium atoms amounted to 25 atomic percent, in terms of the metallic elements without counting the oxygen atoms. The silver-based thin layer 11 was formed of a silver-copper alloy containing 0.8 atomic percent of copper.

These transparent electrodes 34 and 42 were prepared and etched as in Example 1, and annealed at 220° C. for an hour before fabricated into a liquid crystal cell. The electrodes exhibited a sheet resistance of about 3Ω/square.

For comparison, a liquid crystal display device was fabricated in the same manner as above, except that ITO thin layers (refractivity: about 2) were used, instead of the transparent oxide layers 12 and 13. The display device of the invention was found to be brighter by 10% than the comparative display device, and have better display quality.

No deterioration with time was observed in the display device of the invention, which could be driven with less cross-talks than a display device having a single ITO layer as a transparent electrode (sheet resistance: 8Ω/square), establishing a high display quality.

EXAMPLE 10

In this Example, a light-reflecting electrode substrate having a multilayered conductive film of the invention was fabricated.

The light-reflecting electrode substrate had the structure as shown in FIG. 1, and was provided with a light-reflecting multilayered conductive film (electrode) 10 consisting of a transparent oxide thin layer 12 having thickness of 10 nm, a silver-based thin layer 11 having a thickness of 120 nm and a transparent oxide thin layer 13 having a thickness of 70 nm which were sequentially deposited on a grass substrate SUB having a thickness of 0.7 mm.

Both of the transparent oxide thin layers 12 and 13 were formed of a compound oxide material of indium oxide with zirconium oxide. The amount of the zirconium oxide was such that the zirconium atoms amounted to 20 atomic percent of the indium atoms, in terms of the metallic elements without counting the oxygen atoms. The silver-based thin layer 11 was formed of a silver-copper alloy containing 1 atomic percent of gold.

The transparent multilayered conductive film 10 was prepared and etched in a manner similar to that in Example 1, and annealed at 220° C. for an hour.

The reflectance of the light-reflecting multilayered conductive film 10, as compared to aluminum, is shown in FIG. 12, wherein the reflectance of aluminum was assumed as 100%.

For comparison, a light-reflecting conductive film was prepared as in the same manner as above, except that the silver-based thin layer was formed of silver alone. This light-reflecting conductive film showed a reflectance higher than aluminum over almost all visible region, but exhibited a low reflectance of about 86% at a shorter wavelength of about 450 nm.

In contrast, the light-reflecting conductive film of this Example using the silver-based thin layer added with copper exhibited a reflectance higher than aluminum even at a shorter wavelength of about 450 nm, as shown in FIG. 12, ensuring a uniform and high reflectance over the entire visible region.

The light-reflecting conductive film of this Example was stored in air for 2 months, and the changes in the light-reflecting properties were checked. As a result, no changes in the outer appearance of the film, as well as in the reflectance were observed.

EXAMPLE 11

Light-reflecting conductive films were prepared each on a glass substrate in the same manner as in Example 10, except that a compound oxide material of indium oxide with titanium oxide was used for forming the transparent oxide thin layers 12 and 13, and a silver-copper alloy containing various amount of copper was used as the silver-based thin layer 11. The amount of the titanium oxide in each of the transparent oxide layers 12 and 13 was such that the titanium atoms amounted to 20 atomic percent of the indium atoms.

The reflectance at 450 nm of the various light-reflecting conductive films thus obtained was measured, compared to that of aluminum which was assumed as 100%. The results are shown in FIG. 13.

As can be seen from FIG. 13, it was confirmed that the reflectance at a shorter wavelength of 450 nm changes depending on the amount of copper, and that about 86% of the aluminum reflectance is obtained with the copper amount of 0%, about 97% of the aluminum reflectance is obtained with the copper amount of 0.1 atomic percent, and the reflectance reaches the maximum of about 102% to 104% of the aluminum reflectance with the copper amount of 1 to 3 atomic percent and is lowered to about 97% of the aluminum reflectance with the amount of copper of 7 atomic percent.

EXAMPLE 12

In this Example, a light-reflecting electrode substrate was fabricated as in Example 10.

The light-reflecting electrode substrate had the structure as shown in FIG. 2, and was provided with a plurality of light-reflecting multilayered conductive films (electrodes) 10 each consisting of a transparent oxide thin layer 12 having a thickness of 10 nm, a light-reflecting silver thin layer 11 having a thickness of 120 nm and a transparent oxide thin layer 13 having a thickness of 70 nm, which were aligned with each other and sequentially deposited on a grass substrate SUB having a thickness of 0.7 mm. On the multilayered structures, a moisture-resistant, transparent thin film 21 having a thickness of 35 nm was formed, entirely covering the surfaces and side edges of the electrodes.

Both of the transparent oxide thin layers 12 and 13 were formed of a compound oxide material of indium oxide with zirconium oxide. The amount of the zirconium oxide was such that the zirconium atoms amounted to 3 atomic percent of the total of the zirconium atoms and the indium atoms, in terms of the metallic elements without counting the oxygen atoms. The silver-based thin layer 11 was formed of a silver-copper alloy containing 1 atomic percent of gold. The moisture-resistant transparent film 12 was formed of silicon oxide. The light-reflecting electrodes had a stripe shape with a width of 200 µm, and were arranged at a pitch of 210 µm and spaced at a distance of 10 µm. Each electrode has a fine width portion having a width of 20 nm or less, which was the wiring pattern for mounting the liquid crystal-driving IC chip.

The transparent multilayered conductive films 10 were prepared by sequentially forming the transparent oxide thin layer 12, the silver thin layer 11 and the transparent oxide thin layer 13 on a glass substrate, effecting the predetermined pattering by etching, in a manner similar to that in Example 1. Then, the transparent thin film 21 was formed, the obtained structure was subjected to an annealing treatment at 220° C. for 30 minutes.

The reflectance of the light-reflecting multilayered conductive film 10, as compared to aluminum, is shown in FIG. 12, wherein the reflectance of aluminum was assumed as 100%.

The light-reflecting conductive film of this Example was stored in air for one month, and the changes in the light-reflecting properties were checked. As a result, no changes in the outer appearance of the films, as well as in the reflectance, were observed.

EXAMPLE 13

In this Example, a reflective type liquid crystal display device as shown in FIG. 4 was fabricated.

The transparent electrodes $53_1$ to $53_n$ each had a stripe shape with a width of 100 µm, and arranged on a light-scattering film 52 at a pitch of 110 µm. The light-reflecting electrodes 62 each had a stripe shape with a width of 320 µm. The light-reflecting electrodes 62 were arranged at a pitch of 330 µm, and extended in a direction normal to the direction in which the transparent electrodes 53 extended. Each transparent electrode and each light-reflecting electrode had a fine width portion with a width of 20 nm or less.

The transparent electrode 53 were each comprised of the transparent oxide thin layer 12 having a thickness of 40 nm, the silver-based thin layer 11 having a thickness of 15 nm and the transparent oxide thin layer 13 having a thickness of 40 nm.

The light-reflecting electrode 62 were each comprised of a transparent oxide thin layer 12 having a thickness of 10 nm and formed in contact with the rear-side substrate 61 which was a glass substrate, a silver-based thin layer 11 having a thickness of 150 nm and a transparent oxide thin layer 13 having a thickness of 40 nm.

In both the transparent and light-reflecting electrodes 53 and 62, the transparent oxide thin layers 12 and 13 had a refractive index of 2.24, and were each formed of a compound oxide material of indium oxide with cerium oxide, in which the amount of the cerium oxide was such that the cerium atoms amounted to 30 atomic percent of the indium atoms, in terms of the metallic elements without counting the oxygen atoms. The silver-based thin layer 11 in both the electrodes 53 and 62 was formed of a silver-copper alloy containing 0.8 atomic percent of copper.

For comparison, a liquid crystal display device was fabricated as above, except that the electrodes 53 and 62 were formed of ITO having a sheet resistance of 8Ω/square, and thickness of 240 nm, and an aluminum light-reflecting layer was formed on the back side of the rear-side substrate 61. The brightnesses of the screens of both display devices were compared. The display device of the invention was brighter by 10% than the comparative display device, ensuring high display quality. Further, in the comparative display device, shadowing was observed on the displayed characters, but no shadowing was observed in the display device of the invention. Furthermore, in the comparative display device, the displayed characters had double vision because the characters were mirrored on the aluminum reflecting layer. However, no such phenomena was observed in the display device of the invention.

What is claimed is:

1. A multilayered conductive film comprising:
   a silver-based layer formed of a silver-based metallic material and having first and second surfaces;
   a first transparent oxide layer provided on said first surface of said silver-based layer; and
   a second transparent oxide layer provided on said second surface of said silver-based layer;
   said first and second transparent oxide layers being independently formed of a compound oxide material of indium oxide with at least one secondary metal oxide whose metallic element has substantially no solid solubility in silver.

2. The multilayered film according to claim 1, wherein said metallic element having substantially no solid solubility in silver is selected from the group consisting of titanium, zirconium, tantalum, niobium, hafnium, cerium, bismuth, germanium, silicon, chromium, and a combination of two or more of these element.

3. The multilayered film according to claim 1, wherein said metallic element having substantially no solid solubility in silver occupies 5 to 50 atomic percent of a total atomic amount with said indium.

4. The multilayered film according to claim 1, wherein said silver-based metallic material comprises an alloy of silver with a different element which prevents silver migration.

5. The multilayered film according to claim 4, wherein said different element is selected from the group consisting of aluminum, copper, nickel, cadmium, gold, zinc, magnesium, and a combination of two or more of these elements.

6. The multilayered film according to claim 4, wherein said different element is selected from the group consisting of tin, indium, titanium, cerium, silicon, and a combination of two or more of these elements.

7. The multilayered film according to claim 1, wherein said silver-based layer has a thickness of 2 to 20 nm.

8. A transparent electrode substrate comprising the multilayered conductive film of claim 7 provided over a transparent substrate.

9. The electrode substrate according to claim 8, wherein said silver-based metallic material contains 0.1 to 3 atomic percent of copper, gold or mixtures thereof.

10. The electrode substrate according to claim 8, wherein said first and second transparent oxide layers have a refractive index of 2.1 or more.

11. The electrode substrate according to claim 10, wherein said metallic element having substantially no solid solubility in silver is selected from the group consisting of cerium, titanium, zirconium, hafnium, tantalum, and a combination of two or more of these elements.

12. The electrode substrate according to claim 10, wherein said metallic element having substantially no solid solubility in silver comprises cerium or titanium.

13. The electrode substrate according to claim 8, wherein said multilayered conductive film has a small width portion having a minimum width of 50 nm or less.

14. A liquid crystal display device comprising an observer-side electrode substrate, a rear-side electrode substrate arranged opposite to said observer-side electrode substrate, and a liquid crystal material sealed between these electrode substrates, at least one of said electrode substrates being constituted by the transparent electrode substrate according to claim 8.

15. The multilayered film according to claim 1, wherein said silver-based layer has a thickness of 50 nm or more.

16. A liquid crystal display device comprising an observer-side electrode substrate provided with a transparent electrode, a rear-side electrode substrate provided with a light-reflecting electrode and arranged opposite to said observer-side electrode substrate, and a liquid crystal material sealed between these electrode substrates, said light-reflecting electrode being constituted by the multilayered conductive film of claim 15.

* * * * *